United States Patent
Rohde et al.

(10) Patent No.: US 7,265,642 B2
(45) Date of Patent: Sep. 4, 2007

(54) USER-DEFINABLE THERMAL DRIFT VOLTAGE CONTROL OSCILLATOR

(75) Inventors: Ulrich L. Rohde, Upper Saddle River, NJ (US); Ajay Kumar Poddar, Fairlawn, NJ (US); Parimal Patel, Jersey City, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 0 days.

(21) Appl. No.: 11/007,861

(22) Filed: Dec. 9, 2004

(65) Prior Publication Data

US 2005/0156683 A1    Jul. 21, 2005

Related U.S. Application Data

(60) Provisional application No. 60/563,481, filed on Apr. 19, 2004, provisional application No. 60/528,670, filed on Dec. 11, 2003, provisional application No. 60/527,957, filed on Dec. 9, 2003.

(51) Int. Cl.
    *H03B 5/12* (2006.01)
(52) U.S. Cl. .............................. 331/117 D; 331/107 SL
(58) Field of Classification Search .......... 331/107 SL, 331/117 D
    See application file for complete search history.

(56) References Cited

U.S. PATENT DOCUMENTS

| | | | |
|---|---|---|---|
| 2,502,488 A | 4/1950 | Shockley | |
| 2,524,035 A | 10/1950 | Bardeen et al. | |
| 3,373,379 A | 3/1968 | Black | |
| 4,310,809 A | 1/1982 | Buck et al. | |
| 4,338,576 A | 7/1982 | Takahashi et al. | |
| 4,435,688 A | 3/1984 | Shinkawa et al. | |
| 4,527,130 A | 7/1985 | Lutteke | |
| 4,619,001 A | 10/1986 | Kane | |
| 4,621,241 A | 11/1986 | Kiser | |
| 4,633,197 A | 12/1986 | Vanderspool, II | |
| 4,677,396 A | 6/1987 | Cruz et al. | |
| 4,692,714 A | 9/1987 | Galani | |
| 4,812,784 A | 3/1989 | Chung et al. | |
| 4,868,526 A | 9/1989 | Camiade | |
| 5,041,799 A | 8/1991 | Pirez | |
| 5,053,649 A | 10/1991 | Johnson | |
| 5,142,255 A | 8/1992 | Chang et al. | |

(Continued)

FOREIGN PATENT DOCUMENTS

EP    0 475 262 A    3/1992

(Continued)

OTHER PUBLICATIONS

U.L. Rohde, A Novel RFIC for UHF Oscillators (Invited), 2000 IEEE Radio Frequency Integrated Circuits (RFIC) Symposium, Boston, MA, Jun. 11-13, 2000.

(Continued)

*Primary Examiner*—Joseph Chang
(74) *Attorney, Agent, or Firm*—Lerner, David, Littenberg, Krumholz & Mentlik, LLP (57) ABSTRACT

A voltage controlled oscillator that includes a slot-cut-microstrip-line coupled between a resonator, a tuning diode network and an active device and being operable to act as a common-coupling capacitor between the resonator, the tuning diode network and the active device.

28 Claims, 8 Drawing Sheets

U.S. PATENT DOCUMENTS

| | | | |
|---|---|---|---|
| 5,187,451 | A | 2/1993 | Nakamoto et al. |
| 5,231,361 | A | 7/1993 | Smith et al. |
| 5,363,067 | A | 11/1994 | Crandall et al. |
| 5,373,264 | A | 12/1994 | Higgins |
| 5,402,087 | A | 3/1995 | Gorczak |
| 5,434,542 | A | 7/1995 | Veith et al. |
| 5,650,754 | A | 7/1997 | Joshi |
| 5,661,439 | A | 8/1997 | Watkins et al. |
| 5,748,051 | A | 5/1998 | Lewis |
| 5,821,410 | A | 10/1998 | Xiang et al. |
| 5,854,578 | A | 12/1998 | Minasi et al. |
| 5,900,788 | A | 5/1999 | Hagemeyer et al. |
| 6,124,767 | A | 9/2000 | Woods |
| 6,297,708 | B1 | 10/2001 | Lemay |
| 6,326,854 | B1 | 12/2001 | Nicholls et al. |
| 6,486,744 | B1 | 11/2002 | Cann et al. |
| 6,489,853 | B1 | 12/2002 | Lewis |
| 6,501,341 | B2 | 12/2002 | Mashimo et al. |
| 6,624,726 | B2 | 9/2003 | Niu |
| 6,630,869 | B2 | 10/2003 | Flynn et al. |
| 6,714,088 | B2 | 3/2004 | Chang |
| 6,714,772 | B2 | 3/2004 | Kasahara et al. |
| 6,731,181 | B2 | 5/2004 | Fukayama et al. |
| 6,734,745 | B2 | 5/2004 | Sakai |
| 6,737,928 | B2 | 5/2004 | Kubo et al. |
| 2001/0030583 | A1 | 10/2001 | Ikarashi |
| 2001/0035794 | A1* | 11/2001 | Fujidai et al. ............ 331/75 |
| 2002/0084860 | A1 | 7/2002 | Festag et al. |
| 2003/0160660 | A1 | 8/2003 | Chang et al. |
| 2004/0095197 | A1 | 5/2004 | Wang et al. |
| 2004/0130402 | A1 | 7/2004 | Marquardt |
| 2005/0156683 | A1 | 7/2005 | Rohde et al. |

FOREIGN PATENT DOCUMENTS

| | | |
|---|---|---|
| EP | 0 800 224 A | 10/1997 |
| EP | 0 823 777 | 2/1998 |
| EP | 0 843 374 A | 5/1998 |
| EP | 1 093 216 A | 4/2001 |
| JP | 59-072205 A | 4/1984 |
| JP | 59-139708 A | 8/1984 |
| WO | WO-02/17476 A | 2/2002 |
| WO | WO-02/05416 A1 | 11/2002 |

OTHER PUBLICATIONS

U.L. Rohde, D.P. Newkirk, RF/Microwave Circuit Design for Wireless Applications, pp. (123-197), John Wiley & Sons, Apr. 2000, ISBN 0-471-29818-2.

A. K. Poddar, S.K. Koul, and B. Bhat, "Millimeter Wave Evanescent Mode Gunn Diode Oscillator in Suspended Stripline Configuration." 22nd international Conference on Millimeter Waves, pp. 265-266, Jul. 1997.

D. Ham, A. Hajimiri, "Concepts and Methods in Optimization of Integrated LCVCOs," IEEE Journal of Solid-state Circuits, Jun. 2001.

Douglas R. Jachowski, "Passive Enhancement of Resonator Q in Microwave Notch Filters", IEEE MTT-S Digest, pp. 1315-1318, Jun. 2004.

E. Hegazi, H. Sjoland, and A. Abidi, "A Filtering Technique to Lower LC Oscillator Phase Noise," IEEE J. Solid-State Circuits, vol. 36, pp. 1921-1929, Dec. 2001.

Franz X. Sinnesbichler, "Hybrid Millimeter-Wave Push-Push Oscillators using Silicon-Germanium HBTs," IEEE MTT-S, vol. 51, Feb. 2003.

H.C. Chang,"Phase noise self-injection-locked oscillators- Theory and experiment,"IEEE Transactions on Microwave Theory and Techniques, vol. 51, No. 9 , pp. 1994-1999, Sep. 2003.

J. C. Nallatamby, M. Prigent, M. Camiade, J. Obregon, "Phase Noise in Oscillators-Leeson Formula Revisited," IEEE Transactions on Microwave Theory and Techniques, vol. 51, No. 4, pp. 1386-1394, Apr. 2003.

M. Odyniec, Editor, RF and Microwave Oscillator Design, Chapter 3: Linearity, Time Variation, and Oscillator Phase Noise, by T. Lee and A. Hajimiri, Artech House, 2002.

M. Vidmar, "A Wideband, Varactor-Tuned Microstrip VCO," Microwave Journal, Jun. 1999.

U.L. Rohde, D.P. Newkirk, RF/Microwave Circuit Design for Wireless Applications, pp. (123-197; Chapter 5), John Wiley & Sons, Apr. 2000, ISBN 0-471-29818-2.

Wing Shing Chan et al: "The design of oscillators using the cascode circuit" Circuits and Systems, 1994, vol. 5, pp. 689-692, May 30, 1994.

S. Kudszus, W. H. Haydi, A. Tessmann, W. Bronner, and M. Schlechtweg, "PushPush Oscillators for 94 and 140 0Hz Applications Using Standard Pseudomorphic GaAs HEMTs," IEEE MTT-S, Microwave Symp. Digest, 2001, pp. 1571-1574.

Y. Baeyens et al., "Compact InP-based HBT VCOs with a Wide Tuning Range at W-Band," IEEE Trans. MTT, vol. 48, pp. 2403-2408, Dec. 2001.

Y. Sun, T. Tieman, H. Pflung, and W. Velthius, "A Fully Integrated Dual-Frequency Push-Push VCO for 5.2 and 5.8GHz Wireless Applications," Microwave Journal., pp. 64-74, Apr. 2001.

M. Schott, H. Kuhnert, J. Hilsenbeck, J. Wurlf, and H. Heinrich, "38 GHz Push-Push GaAs-HBT MMIC Oscillator,"IEEE MTT-S, Digest, 2002, pp. 839-842.

F. X. Sinnesbichler and O. R. Olbrich, "SiGe HBT Push-Push Oscillators for V-Band Operation," IEEE MTT-S silicon Monolithic Integrated Circuits in RF Systems Symp., Garmisch, Germany, Apr. 26-28, 2000, pp. 55-59.

F. X. Sinnesbichler, H. Geltinger, and G. R. Olbrich, "A 38 0Hz Push-Push Oscillator Based on 25 GHZ-ft BJTs," IEEE Microwave Guided Wave Lett. vol. 9 pp. 151-153, Apr. 1999.

K. W. Kobayashi et al., "A 108-0Hz InP-based HBT Monolithic Push-Push VCO with Low Phase Noise and Wide Tuning Bandwidth," IEEE J. Solid-State Circuits, vol. 34, pp. 1225-1232, Sep. 1999.

L. Dussopt, D. Guillois, and 0. Rebeiz, "A Low Phase Noise Silicon 9 0Hz VCO and an 18 0Hz Push-Push Oscillator," IEEE MTT-S. Digest, 2002, pp. 695-698.

F. X. Sinnesbichier, B Hauntz and 0. R. Olbrich, "A Si/SiGe HBT Dielectric Resonator Push-Push Oscillators at 58 GHz," IEEE Microwave Guided Wave Lett. vol. 10, pp. 145-147, Apr. 2000.

U. L. Rohde, "A New and Efficient Method of Designing Low Noise Oscillators," Ph.D. Dissertation, Technical University of Berlin, Feb. 12, 2004.

Mortazawi A and B. C. De Loach, Jr., "Multiple Element Oscillators Utilizing a New Power Combining Technique," in IEEE MTT-S Tnt. Microwave Symp. Dig., 1992, pp. 1093-1096.

B. Van der Pol, "The Nonlinear Theory of Electrical Oscillators,"Proc. IRE, vol. 22, No. 9, pp. 1051-1086, Sep. 1934.

R. Adler, "A Study of Locking Phenomena in Oscillators,"Proc. IEEE, vol. 61, pp. 180-1385, Oct. 1973.

D. B. Leeson, A Simple Model of Feedback Oscillator Noise Spectrum, Proc. IEEE, pp. 329-332, 1966.

Heng-Chia Chang, Xudong Cao, Umesh K. Mishra, and R. York, "Phase Noise in Coupled Oscillators: Theory and experiment," IEEE Trans. MTT, vol. 45, pp. 604-615, May 1997.

Heng-Chia Chang, Xudong Cao, Mark J. Vaughan, Umesh K. Mishra, and R. York,"Phase Noise in Externally Injection-Locked Oscillator Arrays," IEEE Trans. MTT, vol. 45, pp. 2035-2042, Nov. 1997.

Andrea Borgioli, Pochi Yeh, and Robert A. York, "Analysis of Oscillators with External Feedback Loop for Improved Locking Range and Noise Reduction," IEEE Trans. MTT, vol. 47, pp. 1535-1543, Aug. 1999.

Jonathan J. Lynch and Robert A. York, "Synchronization of Oscillators Coupled through Narrow-Band Networks," IEEE Trans. MTT, pp. 238-249, Feb. 2001.

Klaus F. Schunemann and Karl Behm, "Nonlinear Noise Theory for Synchronized Oscillators," IEEE Trans. MTT, vol. 27, pp. 452-458, May 1979.

Kaneyuki Kurokawa, "The Single Cavity Multiple Device Oscillator," IEEE Trans. MTT, vol. 19, pp. 793-801, Oct. 1971.

Kaneyuki Kurokawa, "Noise in Synchronized Oscillators," IEEE Trans. MTT, vol. 16, pp. 234-240, Apr. 1968.

Byeong-Ha Park, "A Low-Voltage, Low Power, CMOS 900 MHz Frequency Synthesizer," Ph.D. Dissertation, Georgia Institute of Technology, Dec. 1997.

W. 0. Schlosser, "Noise in Mutually Synchronized Oscillators," IEEE Trans. Microwave Theory Tech., vol. MTT-16, pp. 732-737, Sep. 1968.

Heng-Chia Chang, "Analysis of Coupled Phase-Locked Loops With Independent Oscillators for Beam Control Active Phased," IEEE Trans. MTT, vol. 52, pp. 1059-1065, Mar. 2004.

Reidar L. Kuvas, "Noise in Single Frequency Oscillators and Amplifiers," IEEE Trans. Microwave Theory Tech., vol. MTT-21, pp. 127-134, Mar. 1973.

H. Stark, and J. W. Woods, Probability, Random Processes, and Estimation Theory for Engineers. New York: Prentice-Hall, 1986.

R. A. York, P. Liao, and J. J. Lynch, "Oscillator Array Dynamics with Broad-Band N-Port Coupling Networks," IEEE Trans. Microwave Theory Tech., vol. 42, pp. 2040-2045, Nov. 1994.

R. A. York, "Nonlinear Analysis of Phase Relationship in Quasi-Optical Oscillator Arrays," IEEE Trans. Microwave Theory Tech., vol. 41, pp. 1799-1809, Oct. 1993.

Shih-Chieh Yen and Tah-Hsiung Chu,"An Nth-Harmonic Oscillator Using an N-Push Coupled Oscillator Array with Voltage-Clamping Circuits", IEEE, MTT-S Digest, pp. 545-548, 1992.

J. R. Bender, C. Wong, Push-Push Design Extends Bipolar Frequency Range, Microwave & RF, pp. 91-98, Oct. 1983.

Franco Ramirez, Jose Lius Garcia H., Tomas Fernandez and Almudena Suarez,"Nonlinear Simulation Techniques for the Optimized Design of Push-Push Oscillators", IEEE, MTT-S Digest, pp. 2157-2160, 2003.

Jeong-Geun Kim, Dong-Hyun Baek, Sang-Hoon Jeon, Jae-Woo Park and Songcheol Hong, A 60 GHz InGaP/GaAs HBT Push-Push MMIC VCO, IEEE, MTT-S Digest, pp. 885-888, 2003.

F. X. Sinnesbichler, B. Hautz, G. R. Olbrich, "A Low Phase Noise 58 GHz SiGe HBT Push-Push, Oscillator with Simultaneous 29 GHz Output", IEEE, MTT-S Digest, pp. 35-38, 2000.

Hai Xiao, Takayuki Tanka and Masayoshi Aikawa, "A Ka-Band Quadruple-Push Oscillator", IEEE, MTT-S Digest, pp. 889-892, 2003.

R. G. Freitag, S.H. Lee, D.M. Krafcsik, D.E. Dawson and J. E. Degenford, "Stability and Improved Circuit Modeling Considerations for High Power MMIC Amplifiers", IEEE, MM-Wave Monolithic Circuits Symposium, pp. 2169-2172, 2003.

J. Heinbockel and A. Mortazawi, "A Periodic Spatial Power Combining MESFET Oscillator", IEEE, MTT-S Digest, pp. 545-548, 1992.

M. Kuramitsu and F. Takasi, "Analytical method for Multimode Oscillators Using the Averaged Potential, "Elec. Communication Japan, vol. 66-A, pp. 10-19, 1983.

Ronald G. Freitag, "A Unified Analysis of MMIC Power Amplifier Stability," IEEE, MTT-S Digest, pp. 297-300, 1992.

Shigeji Nogi, Jenshan Lin and Tatsuo Itoh., "Mode Analysis and Stabilization of a Spatial Power Combining Array with Strongly Coupled Oscillators," IEEE, MTT, vol. 41, pp. 1827-1837, Oct. 1993.

Amir Mortazawi, Heinrich D. Foltz, and Tatsuo Itoh, "A Periodic Second Harmonic Spatial Power Combining Oscillator", IEEE, MTT, vol. 40, pp. 851-856, May 1992.

Jonathan J. Lynch and Robert A. York, "An Analysis of Mode-Locked Arrays of Automatic Level Control Oscillators," IEEE Trans. on Circuits and Systems-I, vol. 41, pp. 859-865, Dec. 1994.

R. A. York and R.C. Compton, "Mode-Locked Oscillator Arrays", IEEE Microwave and Guided Letter, vol. 1, pp. 215-218, Aug. 1991.

Yu-Lung Tang and Huei Wang, "Triple-Push Oscillator Approach: Theory and Experiments," IEEE- JSS, vol. 36, pp. 1472-1479, Oct. 2001.

J. Everard, Fundamentals of RE Circuit Design with Low Noise Oscillators, John Wiley & Sons. Ltd, 2001.

U.L. Rohde, "Improved Noise Modeling of GaAs FETS: Using an Enhanced Equivalent Circuit Technique," Microwave Journal, pp. 87-101—Nov. 1991.

WA. Pucel, W. Struble, R Hallgren, U.L. Rohde, "A General Noise Dc-embedding Procedure for Packaged Two-Port Linear Active Devices," IEEE Transactions on MTT, vol. 40, No. 11, pp. 2013-2024, Nov. 1992.

U.L. Rohde, "Parameter Extraction for Large Signal Noise Models and Simulation of Noise in Large Signal Circuits Like Mixers and Oscillators," 23rd European Microwave Conference, Madrid, Spain, Sep. 6-9, 1993.

C. Arnaud, D. Basataud, J. Nebus, J. Teyssier, J. Villotte, D. Floriot, "An Active Pulsed RF and Pulsed DC Load-Pull System for the Characterization of HBT Power Amplifiers Used in Coherent Radar and Communication Systems," IEEE Transactions on Mfl, vol. 48, No. 12, pp. 2625-2629, Dec. 2000.

F.M. Ghannouchi, R. Larose, R.G. Bosisio, "A New Multi-harmonic Loading Method for Large-Signal Microwave and Millimeter-Wave Transistor Characterization," IEEE Transactions on MTT, vol. 39, No. 6, pp. 986-992, Jun. 1991.

H. Abe, Y. Aono, "11 GHz GaAs Power MESFET Load-Pull Measurements Utilizing a New Method of Determining Tuner Y-Parameters," IEEE Transactions on Microwave Theory and Techniques, vol. 27, No. 5, pp. 394-399, May 1979.

Q. Cai, J. Gerber, S. Peng, "A Systematic Scheme for Power Amplifier Design Using a Multi-Harmonic Load-Pull Simulation Technique," 1998 IEEE MTT-S Symposium Digest, vol. 1, pp. 161-165, Jun. 7-12, 1998.

P. Berini, M. Desgagne, F.M. Ghannouchi, R.G. Bosisio, "An Experimental Study of the Effects of Harmonic Loading on Microwave MESFET Oscillators and Amplifiers," IEEE Transactions on MTT, vol. 42, No. 6, pp. 943-950, Jun. 1994.

A. M. Elsayed and M. I. Elmasry, "Low-Phase-Noise LC Quadrature VCO using Coupled Tank Resonators in Ring," IEEE, JSSC, vol. 36, pp. 701-705, Apr. 2001.

M. Ticbout,"Low power, Low Phase Noise, Differentially Tuned Quadrature VCO Design in Standard CMOS," IEEE- JSSS, vol. 36, pp. 10 18-1024, Jul. 2001.

K.O., "Estimation Methods for Quality Factors of Inductors Fabricated in Silicon Integrated Circuit Process Technologies," IEEE, JSSS, pp. 1565-1567, Sep. 1997.

A.V. Grebennikov, "Microwave Transistor Oscillators: an Analytic Approach to Simplify Computer-Aided Design", Microwave Journal, pp. 294-299, May 1999.

Andrew V. Grebennikov, "Microwave FET Oscillators: an Analytic Approach to Simplify Computer-Aided Design", Microwave journal, pp. 102-111, Jan. 2000.

Jwo-Shiun Sun, "Design Analysis of Microwave Varactor-Tuned Oscillators", Microwave journal, pp. 302-308, May 1999.

M. Regis, 0. Llopis, and J. Graffeuil, "Nonlinear Modeling and Design of Bipolar Transistor Ultra Low Phase-Noise Dielectric-Resonator Oscillators", IEEE transaction on MTT, vol. 46, No. 10, pp. 1589-1593, Oct. 1998.

R. J. Hawkins, "Limitations of Nielsen's and Related Noise Equations Applied to Microwave Bipolar Transistors and a New Expression for the Frequency and Current Dependent Noise Figure," Solid-State Electron., vol. 20 pp. 191-196, 1977.

T. H. Hsu and C.P. Snapp, "Low-Noise Microwave Bipolar Transistor with Sub-Half-Micrometer Emitter Width," IEEE Trans. Electron Devices, vol. ED-25, pp. 723-730, Jun. 1978.

U. L. Rohde, K. Juergen Schoepf, A.K. Poddar, "Low Noise VCOs Conquer Wideband," Microwaves & RF, pp. 98-106, Jun. 2004.

A. K. Poddar and K. N. Pandey, "Microwave Switch using MEMS technology," 8th IEEE International Symposium, EDMO-2000, pp. 134-139, Nov. 2000, UK.

A. Ward and B. Ward, "A Comparison of various Bipolar Transistor Biasing Circuits," Applied Microwave & Wireless, vol. 13, pp. 30-52, 2001.

U. L. Rohde, A. K. Poddar, Juergen Schoepf, Reimund Rebel, and Parimal Patel, "Low Noise Low Cost Wideband N-Push VCO," IEEE, IMS Symposium, MTT2005, USA.

K. Poddar, "A Novel Approach for Designing Integrated Ultra Low Noise Microwave Wideband Voltage-Controlled Oscillators," Dec. 14, 2004.

* cited by examiner

USER-DEFINABLE THERMAL DRIFT VOLTAGE CONTROL OSCILLATOR

CROSS-REFERENCE TO RELATED APPLICATIONS

This application claims the benefit of the filing date of U.S. Provisional Patent Application Nos. 60/527,957 filed Dec. 9, 2003; 60/528,670 filed Dec. 11, 2003; and 60/563,481 filed Apr. 19, 2004, the disclosures of which are hereby incorporated herein by reference.

BACKGROUND OF THE INVENTION

A voltage controlled oscillator (VCO) or oscillator is a component that can be used to translate DC voltage into a radio frequency (RF) voltage or signal. The magnitude of the output signal is dependent on the design of the VCO circuit and the frequency of operation is determined by a resonator that provides an input signal. Clock generation and clock recovery circuits typically use VCOs within a phase locked loop (PLL) to either generate a clock from an external reference or from an incoming data stream. VCOs affect the performance of PLLs. In addition, PLLs are typically considered essential components in communication networking as the generated clock signal is typically used to either transmit or recover the underlying service information so that the information can be used for its intended purpose. PLLs are also important in wireless networks as they enable the communications equipment to quickly lock onto the carrier frequency on which communications are transmitted.

The popularity of mobile telephones has renewed interest in and generated more attention in wireless architectures. This popularity has further spawned renewed interest in the design of low noise wideband oscillators. The recent explosive growth in the new families of cellular telephones and base stations using universal mobile telephone systems (UMTS) has stirred a need for developing an ultra-low noise oscillator with a fairly wide tuning range. The demands of wideband sources have generally increased telescopically because of the explosive growth of wireless communications. In particular, modern communication systems are typically multi-band and multi-mode, therefore requiring a wideband low noise source that preferably allows simultaneous access to DCS 1800, PCS 1900 and WCDMA (wideband code division multiple access) networks by a single wideband VCO.

The dynamic operating range and noise performance of a VCO may limit or affect the performance of the PLL itself, which in turn may affect the performance of the device in which the PLL is employed, e.g., RF transceivers, a cell phone, a modem card, etc. Broadband tunability of VCOs represents one of the more fundamental tradeoffs in the design of a VCO, impacting both the technology and the topology used. The dynamic time average quality factor (i.e., Q-factor) of the resonator as well as the tuning diode noise contribution affect the noise performance of a VCO. Furthermore, the dynamic loaded Q is, in general, inversely proportional to the operating frequency range of the VCO.

Despite the continuous improvement in VCO technology, low phase noise typically remains a bottleneck and poses a challenge to RF transceiver (transmitter-receivers) design. In addition, oscillator/VCO design typically poses a challenge to the RF trans-receiver system. This is typically considered due to the more demanding parameters of the VCO design: low phase noise, low power consumption and wide frequency tuning range.

Improvements in oscillator/VCO technology have continued with time, yielding ever-smaller sources with enhanced phase noise and tuning linearity but the phenomena of the thermal drift over the temperature range (−40° C. to +85° C.) has not been properly addressed. The wide operating temperature range of the oscillator/VCOs coupled with a general lack of information on the thermal drift-profile creates a need for the development of a uniform and user-definable thermal drift profile oscillator with a relatively low thermal drift over the wide operating temperature range and operating frequency band.

Usually, high-stability oscillators are built with a quartz crystal up to frequencies of several hundred megahertz. However, in order to achieve better stability and lower costs, the SAW (surface acoustic wave) resonator based oscillator is generally considered a better choice for an ultra low phase noise low thermal drift oscillator. SAW resonators are typically used in oscillators as a two-port resonator and have a relatively small pull-in range that usually does not support a sufficient tuning range to compensate for tolerances due to the circuit components and thermal drift over the operating temperature range (−40° C. to +85° C.). In addition, SAW devices are comparatively expensive compared to CROs (ceramic resonator based oscillator) and their availability and performance are limited to a selected frequency and narrow operating temperature range (−20° C. to +70° C.) making them unsuitable for operating in stringent temperature environments and/or low cost applications.

In addition, the thermal drift of a ceramic resonator based oscillator/VCOs is typically around 5–10 MHz over a temperature range of −40° C. to +85° C. The ceramic resonator based VCO is usually also susceptible to phase hits that may occur in a PLL.

Thus, there is a need for a user-definable thermal drift oscillator operable over a wide temperature range, which offers a cost-effective solution to the phase hit problem.

SUMMARY OF THE INVENTION

An aspect of the present invention is an oscillator. The oscillator preferably comprises an active device having first, second and third terminals and circuitry coupled between the first and second terminals of the active device. The circuitry is preferably operative to provide a bias voltage to the active device and feedback a select amount of phase noise to the active device.

The oscillator further preferably comprises a tuning diode coupled to the second terminal of the active device through a slot-cut-printed-board coupling network.

In accordance with this aspect of the present invention, the slot-cut-printed-board coupling network desirably acts as an evanescent mode buffer between a resonator coupled thereto and the active device.

Further in accordance with this aspect of the present invention, the slot-cut-printed-board coupling network operates to control a profile of the thermal drift of the active device or, in general, the oscillator.

Further still in accordance with this aspect of the present invention, a feedback capacitor is preferably coupled between the second and third terminals of the active device. In addition, the oscillator may further desirably comprise a first filter and a second filter coupled to the third terminal so as to provide two-stage regenerative filtering.

Further in accordance with this aspect of the present invention, the active device may comprise a bipolar transistor or a field effect transistor and the first, second and third terminals respectively comprise the collector, base and emitter nodes of either of the transistors.

Another aspect of the present invention is an oscillator that preferably comprises an active device and circuitry coupled between a resonator, a tuning diode network and the active device. The circuitry is preferably operable to act as a common-coupling capacitor between the resonator, the tuning diode network and the active device.

In accordance with this aspect of the present invention, the circuitry controls a thermal drift profile of the oscillator over an operating temperature range. In accordance with this aspect of the present invention, the circuitry desirably comprises a slot-cut-microstrip-line, whose dimensions are selectable to define a thermal profile of the oscillator.

Further in accordance with this aspect of the present invention, the circuitry acts as an evanescent-mode-buffer between the resonator and the active device. Further still, the tuning diode network is capacitively coupled to the circuitry.

Further in accordance with this aspect of the present invention, the resonator preferably comprises a ceramic resonator. Further still, the active device desirably comprises either a field effect transistor or a bipolar transistor.

In another aspect, the present invention comprises an apparatus comprising a phase lock loop for generating a clock signal used to transmit or recover information communicated from or to the apparatus. In addition, the phase lock loop preferably comprises a voltage-controlled oscillator for generating the clock signal. Most preferably, the voltage-controlled oscillator preferably comprises an active device; and a slot-cut-microstrip-line coupled between a resonator, a tuning diode network and the active device that is operable to act as a common-coupling capacitor between the resonator, the tuning diode network and said active device.

Preferably, the apparatus comprises a wireless device and most preferably comprises a cellular telephone. In addition, the apparatus may also comprise a personal digital assistant.

In another aspect, the present invention comprises an apparatus that comprises a phase lock loop for generating a clock signal used to transmit or recover information communicated from or to the apparatus. The phase lock loop desirably includes a voltage-controlled oscillator for generating the clock signal. The voltage controlled oscillator preferably comprises an active device; and a slot-cut-microstrip-line coupled between a resonator, a tuning diode network and the active device and operable to act as a common-coupling capacitor between the resonator, the tuning diode network and said active device. The apparatus may desirably comprise a wireless device, and most desirably comprises a cellular telephone. Further in accordance with this aspect of the present invention, the apparatus preferably comprises a personal digital assistant.

In another aspect, the present invention comprises a telephone. The telephone preferably comprises a phase lock loop for generating a clock signal used to transmit or recover information communicated from or to the telephone. The phase lock loop preferably comprises a voltage-controlled oscillator for generating the clock signal, the voltage controlled oscillator comprising, an active device; and circuitry coupled between a resonator, a tuning diode network and the active device and operable to act as a common-coupling capacitor between the resonator, the tuning diode network and said active device. In accordance with this aspect of the present invention, the information may be communicated over a wireless or wired network.

In a method aspect, the present invention comprises coupling a capacitor between a resonator, a tuning diode network and an active device; and operating the capacitor as an evanescent mode buffer between the resonator and the active device to compensate for drifts in an output frequency of the oscillator due to temperature changes.

The method may further desirably comprise biasing the active device at a predetermined voltage such that the capacitor maintains the predetermined voltage level by compensating for drifts in an output frequency of the oscillator due to temperature changes. Further in accordance with the method, the evanescent mode buffer compensates for drifts in the output frequency of the oscillator due to temperature changes by storing additional energy generated by the oscillator due to temperature changes.

DETAILED DESCRIPTION

Figure 1A:
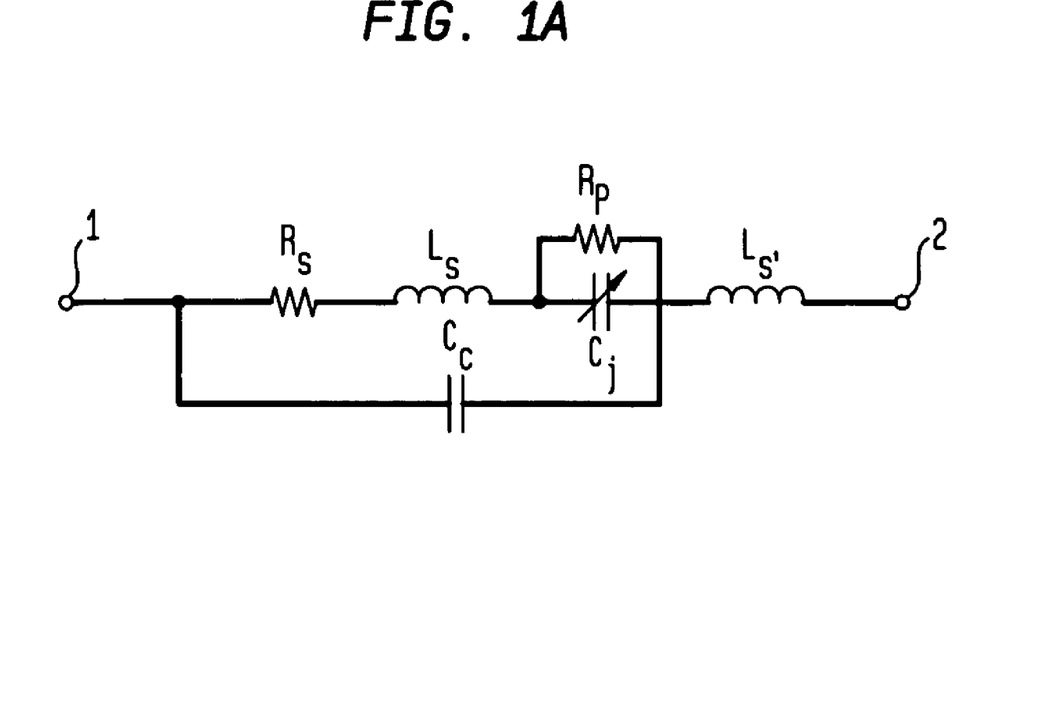
FIGS. 1A and 1B depict circuits of a tuning diode in accordance with an aspect of the present invention.
Figure 1B:
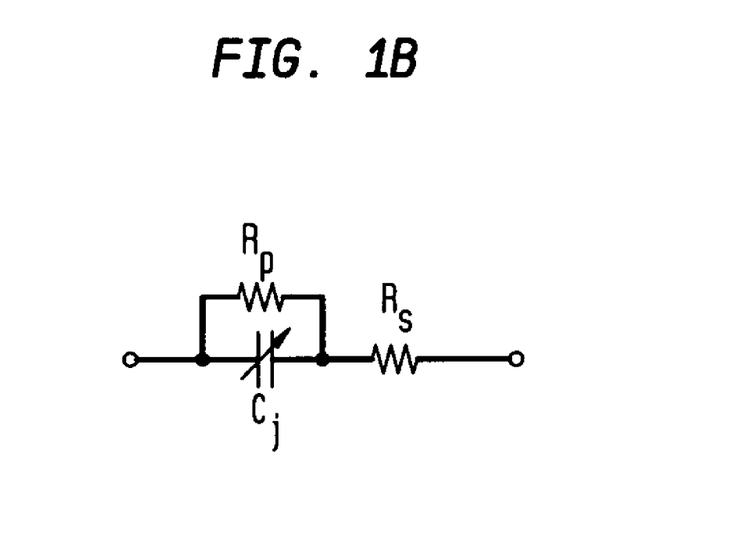

FIGS. 1A and 1B depict circuits that illustrate a tuning diode using resistors, capacitors and inductors. As shown in FIG. 1A, a tuning diode may be depicted as a two-port device (as shown, ports 1 and 2) having a resistor $R_s$ connected to port 1 and in series with an inductor $L_s$. $R_s$ and $L_s$ are connected in series to resistor $R_p$ and a variable capacitor $C_j$, which are in parallel with each other. $C_j$ reflects the junction capacitance of the tuning diode and is variable in response to temperature changes. The circuit further includes a capacitor $C_c$ in parallel with $R_s$, $L_s$ and $C_j$ between ports 1 and 2 and an inductor $L_s$, between port 2, $C_j$, $C_c$ and $R_p$, as shown.

FIG. 1B shows a simplified equivalent circuit of a tuning diode and includes resistor $R_p$ in parallel with capacitor $C_c$. The capacitor $C_c$ is also in series with resistor $R_s$.

With reference to FIGS. 1A and 1B, the expression for the junction capacitance of the tuning diode under a reverse bias condition is given by:

$$C_j(\varepsilon_r, d_j, A, V) = \frac{dQ}{dV} = \frac{\varepsilon_0 \varepsilon_r(T) A}{d_j} = \left[ \frac{\varepsilon_0 \varepsilon_r A}{\frac{[2K_s\varepsilon_o(V_{bi} - V_A)}{q} \frac{(N_A + N_D)]^{1/2}}{N_A N_D}} \right]$$

Under the abrupt junction assumption, the depletion region thickness, $d_j$, is given by:

$$d_j = \left[ \frac{[2K_s\varepsilon_o(V_{bi} - V_A)}{q} \frac{(N_A + N_D)]^{1/2}}{N_A N_D} \right]$$

Where, $N_D$ and $N_A$ are the donor and acceptor volume densities. $V_{bi}$ is the built-in potential and is given by:

$$V_{bi} = \left[\frac{kT}{q}\right] \ln \left[\frac{N_A N_D}{n_i^2}\right]$$

Under reverse bias conditions, the spacing $d_j$ is a function of the applied voltage $V_A < 0$ and this effect is used to produce a variable capacitor. The equivalent capacitance of a junction per unit area is given as:

$$c(q, B, \varepsilon) = \frac{C_j(\varepsilon_r, d_j, A)}{A} = \varepsilon_0 \varepsilon_r(T) \frac{dE}{dV} = \left[\frac{qBe^{(m+1)}}{(m+2)(V+\phi)}\right]^{1/(m+2)}$$

$$c(q, B, \varepsilon) = \frac{\varepsilon_0 \varepsilon_r}{\frac{[2K_s\varepsilon_o(V_{bi} - V_A)}{q} \frac{(N_A + N_D)]^{1/2}}{N_A N_D}}$$

$$Q = \epsilon_0 \epsilon_r(T) E$$

Where,
Q=Charge per unit area
$\epsilon = \epsilon_0 \epsilon_r$, $\epsilon_r$=Dielectric constant
A=Device cross sectional area
d=Depletion layer width
c=Capacitance per unit area
m=Impurity exponent
q=Charge
B=Magnetic field
T=Temperature
V=Reverse voltage applied across the diode
E=Electric field Combining all the constant terms together, including the area of the diode, into the constant, $C_d$, the expression for capacitance is given as:

$$C_j(\varepsilon_r, d_j, A, V) = \frac{C_d}{(V+\phi)^\gamma}$$

$$C_d = C_0(\phi)^\gamma$$

$$C = C_c + C_j(\epsilon_r, d_j, A, V)$$

Where, $\gamma$=Capacitance exponent and depends on the doping geometry of the diode. Its value varies from 1/3 to 2 for Si (silica) diode. The value of $\gamma$ for an abrupt junction diode is 1/2, but such diodes have a limited tuning ratio. For wideband tunability, a hyper abrupt junction diode is preferred, and value of $\gamma$ is 1 or 2.

$\phi$=The junction contact potential (0.7V for Si (silica))
$C_0$=Value of capacitance at zero voltage
$C_c$=Case capacitance
$C_j$=Junction capacitance The tuning ratio (TR) is given by $$TR = \frac{C_j(V_2 = V_{\min})}{C_j(V_1 = V_{\max})} = \left[\frac{(V_1 + \phi)}{(V_2 + \phi)}\right]^\gamma$$

The oscillator frequency varies proportionally to $1/\sqrt{C}$ and for the linear tuning range junction capacitance should vary as $1/V^2$ ($\gamma=2$). The frequency ratio is given as the square root of the tuning ratio TR.

The Q of the tuning diode is a function of the reverse bias voltage, frequency and temperature. The expression for the Q of the tuning diode is given by:

$$Q = 2\pi \left[\frac{\text{Stored} - \text{Energy}}{\text{Dissipated} - \text{energy}}\right] = \frac{\omega C R_p^2}{R_p + R_s + \omega^2 C^2 R_s R_p^2}$$

$$C = [C_c + C_j(\varepsilon_r, d_j, A, V)] = C_c + \frac{C_d}{(V+\phi)^\gamma}$$

The Q of the tuning diode falls off at high frequency due to the series bulk-resistance $R_s$ and can be expressed as $$[Q]_{High-frequency} = \left[\frac{\omega C R_p^2}{R_p + R + \omega^2 C^2 R_s R_p^2}\right]_{\omega \gg}$$

$$\approx \left[\frac{\omega C R_p^2}{\omega^2 C^2 R_s R_p}\right] \Rightarrow \left[\frac{1}{\omega C R_s}\right] [Q]_{High-frequency} \propto \frac{1}{R_s}$$

The Q of the tuning diode falls off at low frequencies due to the back resistance of the reverse-biased diode $R_p$ and can be expressed as:

$$[Q]_{Low-frequency} = \left[\frac{\omega C R_p^2}{R_p + R_s + \omega^2 C^2 R R_p^2}\right]_{\omega \ll} \approx \left[\frac{\omega C R_p^2}{R_p + R_s}\right] \Rightarrow \omega C R_p$$

$$[Q]_{Low-frequency} \propto R_p$$

Where
$R_p$=Parallel resistance or back resistance of the diode
$R_s$=Bulk resistance of the diode-device material
$L_s$=Internal lead inductance
$L_s$=External lead inductance
$C_c$=Case capacitance As the junction-temperature increases, the leakage current increases and it lowers the back resistance $R_p$ of the diode. The increase in the junction temperature causes a slight decrease in $R_s$, but the effects of the decreasing $R_p$ are greater and this forces the effective Q to decrease.

The change in the value of the capacitance of the tuning diode with respect to temperature causes frequency drifts of the oscillator/VCOs circuit. The change in the value of the capacitance with temperature can be given by:

$$C \propto [T]^{T_{cc}}$$

$$C(V) = \frac{C(0)}{(V+\phi)^{\gamma}}$$

$$\frac{dC(V)}{dT} = \frac{\gamma C(0)}{(V+\phi)^{(\gamma+1)}} \frac{d\phi}{dT}$$

$$T_{CC} = \left[\frac{1}{C(V)}\right]\left[\frac{dC(V)}{dT}\right] = -\left[\frac{\gamma}{(V+\phi)}\right]\left[\frac{d\phi}{dT}\right]$$

$$\frac{d\phi}{dT} \approx -2.3(\text{mV}/^{\circ}C), \text{ for } Si(\text{silica})$$

Where $T_{cc}$ is a temperature coefficient.

From above, the temperature coefficient $T_{cc}$ is inversely proportional to the applied voltage and directly proportional to the diode slope $\gamma$. In addition, tuning diode capacitance increases with an increase in temperature, whereas capacitance drift decreases with an increase in reverse bias voltage, i.e., at a higher reverse voltage drift is at a minimum as compared to at a low reverse voltage. The capacitance constant $C_d$ is a function of the geometric dimension and varies with the dielectric constant, which is also a function of temperature.

The net thermal drift of an oscillator/VCO is generally due to the tuning diode, active device, resonator and passive components in the oscillator circuitry. The approach of adding a negative temperature coefficient compensating capacitor typically does not compensate for the tuning diode temperature coefficient $T_{cc}$ because the change in the capacitance is not constant, but instead varies with the applied reverse bias voltage across the tuning diode over the temperature. The general approach of nullifying the temperature dependency of the tuning diode's built-in contact potential $\phi$ by adding a forward bias diode or transistor-emitter-follower in series with the tuning voltage of the tuning diode network comes at the cost of higher phase noise and non-uniform thermal drift over the temperature range.

In accordance with an aspect of the present invention, the thermal drift is compensated for by introducing a common coupling-capacitor between a resonator, an active device and a tuning diode network of an oscillator. The coupling capacitor may comprise a slot-cut-microstripline or any other variable capacitive storage element. The slot-cut-microstripline controls the profile of the thermal drift and also acts as an evanescent-mode-buffer between the resonator and the active device, so that the time average dynamic loaded Q of the resonator is enhanced and provides low noise performance over the operating frequency band of the oscillator.

Figure 2:
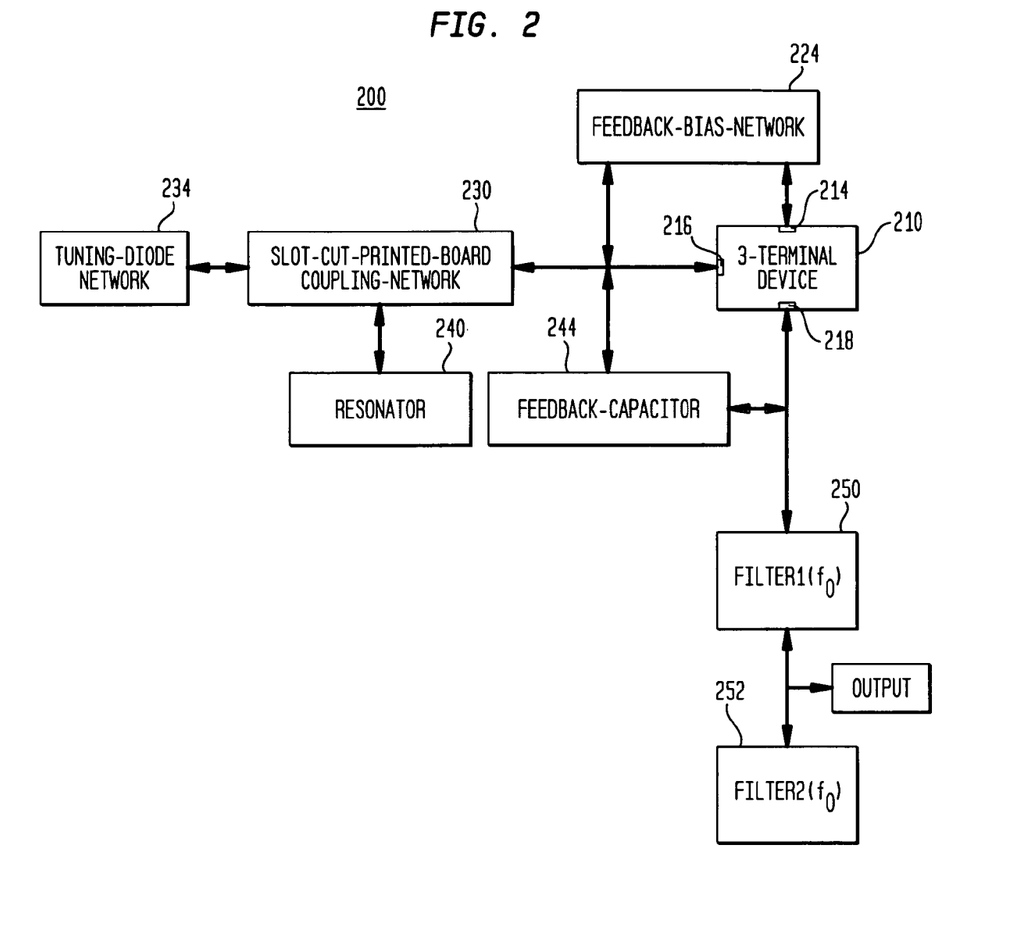
FIG. 2 depicts a schematic of an oscillator in accordance with an aspect of the present invention.

In particular, FIG. 2 shows an oscillator 200 in accordance with an aspect of the present invention. The oscillator includes a three-terminal device 210 having a first terminal 214, a second terminal 216 and a third terminal 218. The three-terminal device may comprise any three-terminal device that can provide a 180° phase shift between any two terminals and preferably includes a bipolar or field effect transistor. A feedback-bias network 224 is connected between the first and second terminals, 214, 216, respectively. A slot-cut-printed-board-coupling network 230 is coupled to the second terminal and to a tuning diode network 234. The slot-cut-printed-board-coupling network 230 is also coupled to a resonator 240. In addition, the oscillator 200 includes a feedback capacitor 244 between the second and third terminals, 216, 218, respectively, and a pair of filters, 250, 252 coupled in series to the third terminal 218. An output signal is taken between first filter 250 and second filter 252.

In accordance with this aspect of the present invention, the slot-cut-printed-board-coupling network 230 compensates for capacitance changes in the tuning-diode network 234 due to changes in operating temperature of the environment or the oscillator 200. In addition, and as discussed in further detail below, the slot-cut-printed-board-coupling network 230 may be implemented so as to define the thermal drift profile of the oscillator, i.e., the change in output frequency due to change in operating temperature. The physical dimensions of the slot-cut-printed-board may be chosen to define a particular thermal profile, e.g., see FIGS. 5-8. The slot-cut-printed-board-coupling network 230 also acts as an evanescent mode buffer between the resonator 240 and the three terminal device 210 by storing additional energy that may develop in the oscillator as the temperature changes. The additional energy is then typically released without increasing the phase noise of the output signal. In particular, the network 230 provides a storage element, e.g., a capacitor, that generally operates to store excess energy that may develop in the circuit due to temperature changes and releasing such energy so that phase noise performance of the oscillator is controlled during the temperature changes. For example, if the bias voltage increases due to a change in temperature, the capacitor assists in lowering the bias voltage to or near the optimal operating point.

Figure 3:
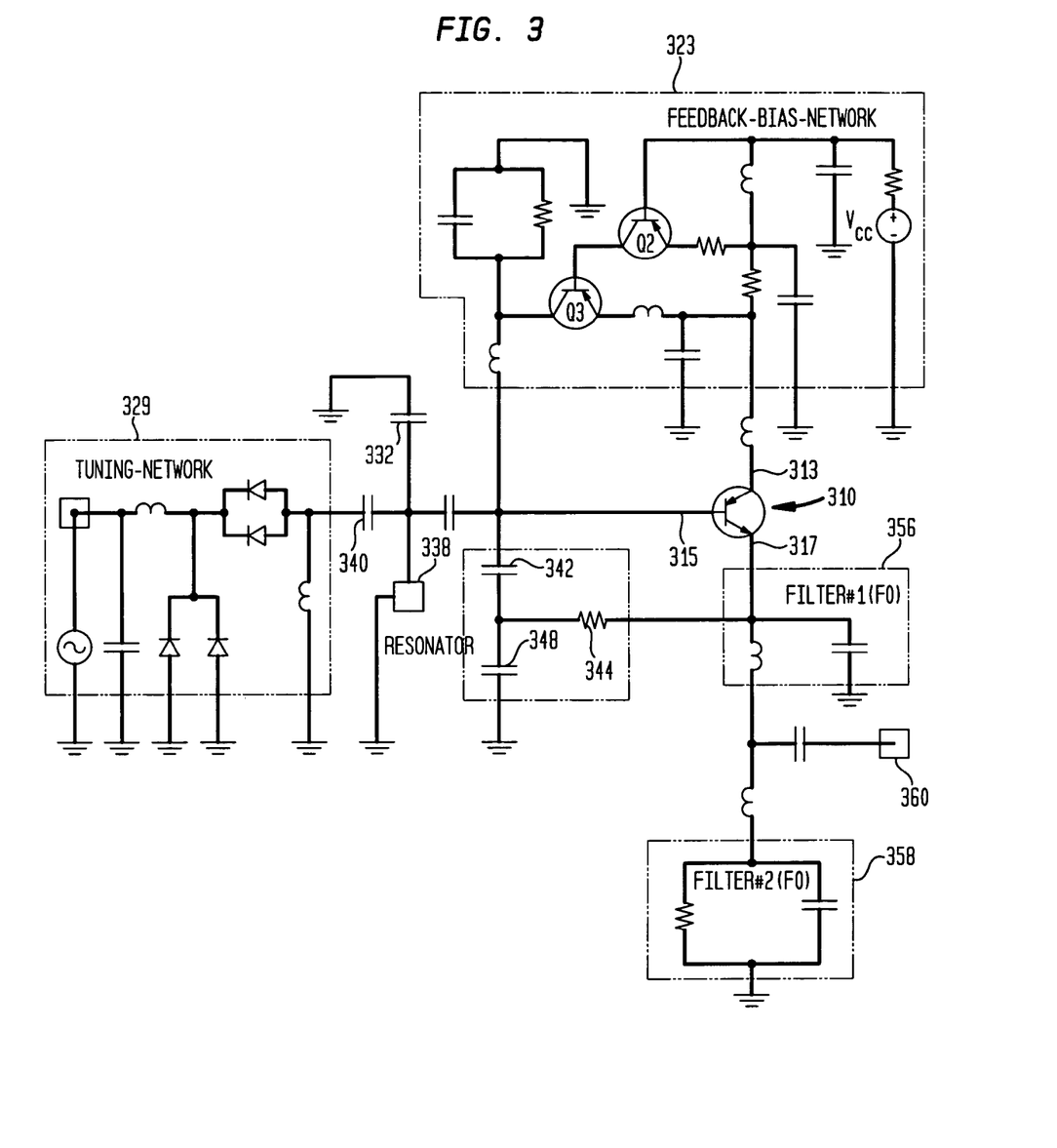
FIG. 3 depicts a schematic of an oscillator in accordance with an aspect of the present invention.

Turning now to FIG. 3, there is illustrated a oscillator 300 in accordance with an aspect of the present invention. The oscillator includes an active device 310 having three terminals, 313, 315, 317. The active device 310 may comprise a bipolar transistor or field effect transistor wherein the first, second and third terminals 313, 315, 317 comprise, respectively, the collector, base and emitter nodes of the transistor. In general, the active device 310 may comprise any device that can provide a 180° phase shift between the first terminal 313 and second terminal 315.

The first terminal 313 is connected to a feedback-bias network 323. The network 323 includes a voltage source Vcc coupled to the first terminal 313 that is used for biasing the active device 310 by providing a predetermined voltage at the first terminal 313. The network 323 also includes a pair of transistors Q2, Q3 (which are illustrated as bipolar transistors, but may also be field effect transistors) and associated circuit elements such as capacitors, resistors and inductors that couple a selected amount of the signal from the first terminal 313 to the second terminal 315.

The second terminal 315 is also capacitively coupled to tuning network 329, slot-cut-printed-board-coupling capacitor 332 and a resonator 338. As shown, the tuning network 329, slot-cut-printed-board-coupling capacitor 332 and resonator 338 are coupled in parallel. In addition, the tuning network 329 is capacitively coupled via coupling capacitor 340. The slot-cut-printed-board-coupling capacitor 332 compensates for changes in the capacitance, which are in turn caused by the changes in the junction contact potential, e.g., $d\phi/dT$, of the tuning network 329 as a result of changes in the operating temperature of oscillator 300 or the environment.

The oscillator 300 further includes a feedback capacitor 342 that is coupled to the third terminal 317 through a resistor 344 and to ground through capacitor 348. Capacitor 342, resistor 344 and capacitor 348 together form a network that feeds back a select portion of the signal from the third terminal 317 to the second terminal 315. The oscillator 300 also includes a pair of filters 356, 358 coupled to the third terminal 317 that provide two-stage regenerative filtering. An output signal is capacitively coupled to output port 360 between the filters 356, 358. As shown, filter 356 preferably comprises an LC filter and filter 358 preferably comprises an RC filter. The time constants of these filters are preferably adjusted to the fundamental frequency of operation.

Figure 4:
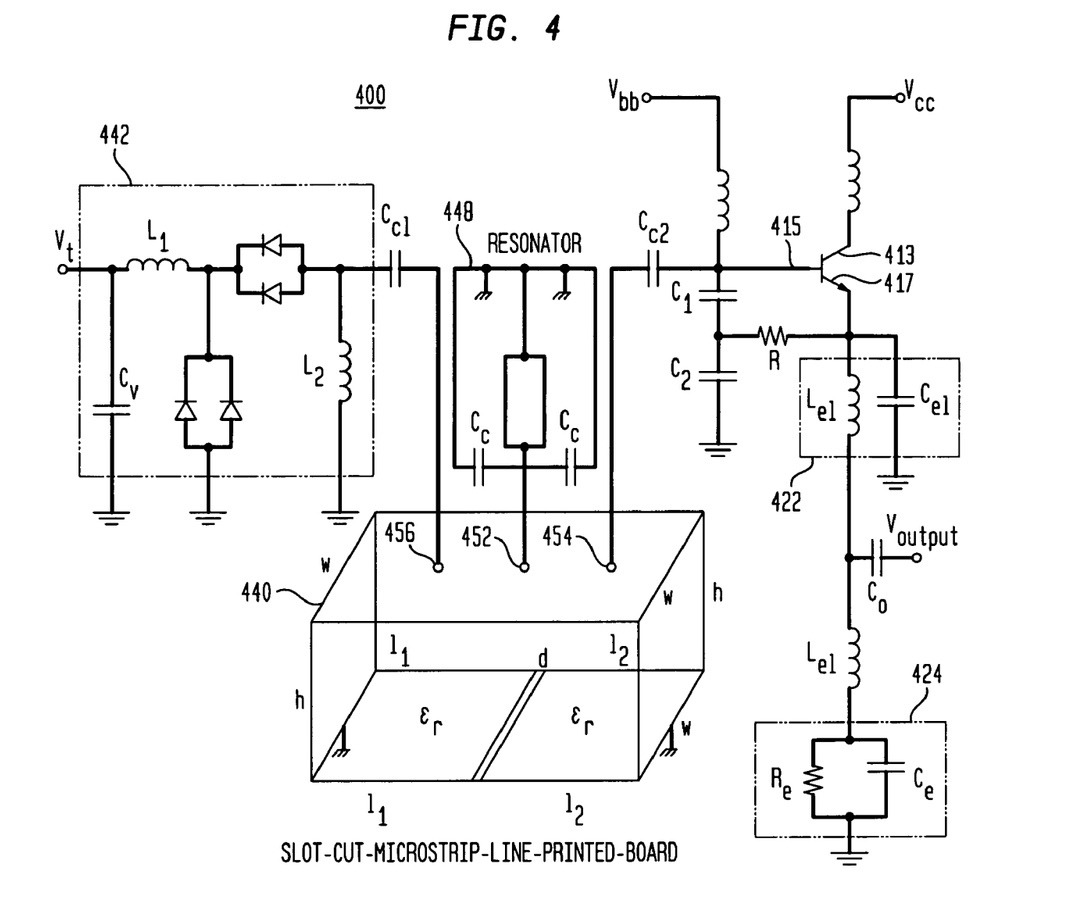
FIG. 4 depicts a schematic of an oscillator in accordance with an aspect of the present invention.

Turning now to FIG. 4, there is shown an oscillator 400 in accordance with another aspect of the present invention. The oscillator 400 includes a three-terminal device 410 that is inductively coupled to a bias voltage source $V_{cc}$ via first terminal 413. The second terminal 415 of the device 410 is inductively coupled to a second voltage source $V_{bb}$. A feedback capacitor $C_1$ is coupled to third terminal 417 through a resistor R. The third terminal 417 is also coupled to first and second filters, 422, 424, to provide regenerative filtering. In addition, the oscillator includes a slot-cut-microstrip-line-printed board 440 that is coupled to a tuning diode network 442, a resonator 448 and the second terminal 415 of the three terminal device 410. The tuning network 442 includes circuit elements that are similarly arranged as discussed above in relation to tuning network 329.

The resonator 448 is preferably a ceramic resonator and is capacitively coupled to terminal 452 of the slot-cut-microstrip-line-printed board 440. The tuning network 442 and second terminal 415 are similarly coupled to terminals 454 and 456 of the slot-cut-microstrip-line-printed board 440. As shown, the slot-cut-microstrip-line-printed board 440 includes a width, w, a height, h, and length dimensions, $l_1$ and $l_2$. The board 440 also includes a slot d that divides the base of the board 440 into two regions defined by length dimensions, $l_1$ and $l_2$. These dimensions define the size of the board 440 and can be selected to define the thermal profile of the oscillator. In accordance with this aspect of the present invention, the structure is designed to increase the loaded time average quality factor over the temperature range by selecting an optimum length-width ratio (L/W-ratio) of each side of the slot-cut-microstrip-line coupling-capacitor. In general, the printed board 440 preferably comprises a variable capacitor or storage element that operates as an evanescent mode buffer and allows a user to define a thermal profile.

Figure 5:
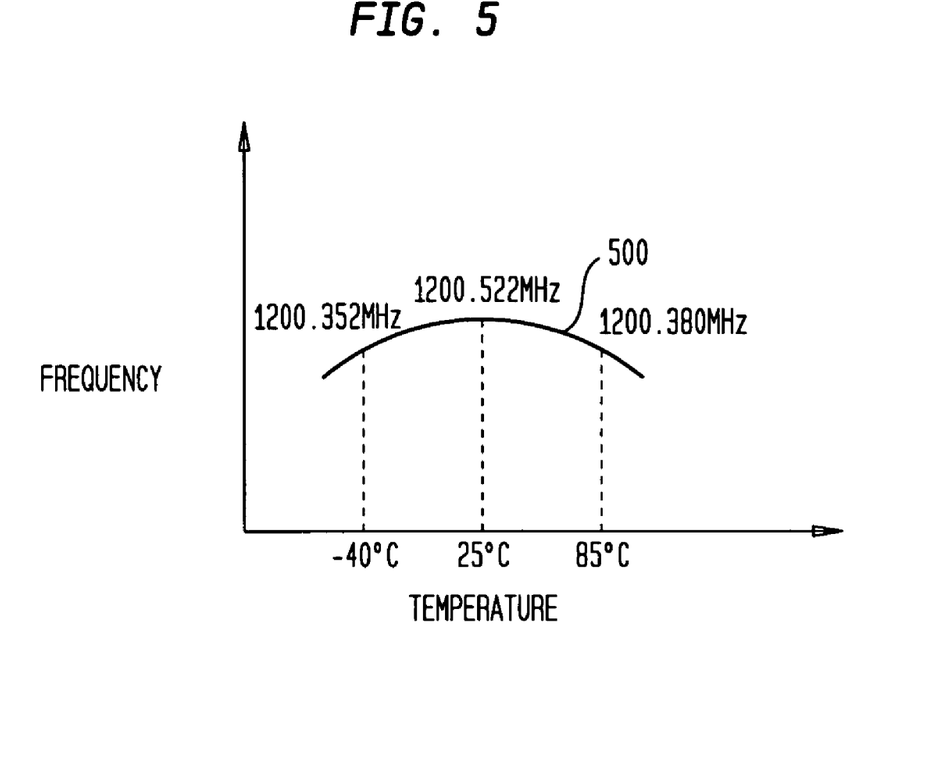
FIG. 5 illustratively depicts a user-definable thermal profile plot over the temperature range of −40° C. to +85° C. in accordance with an aspect of the present invention.
Figure 6:
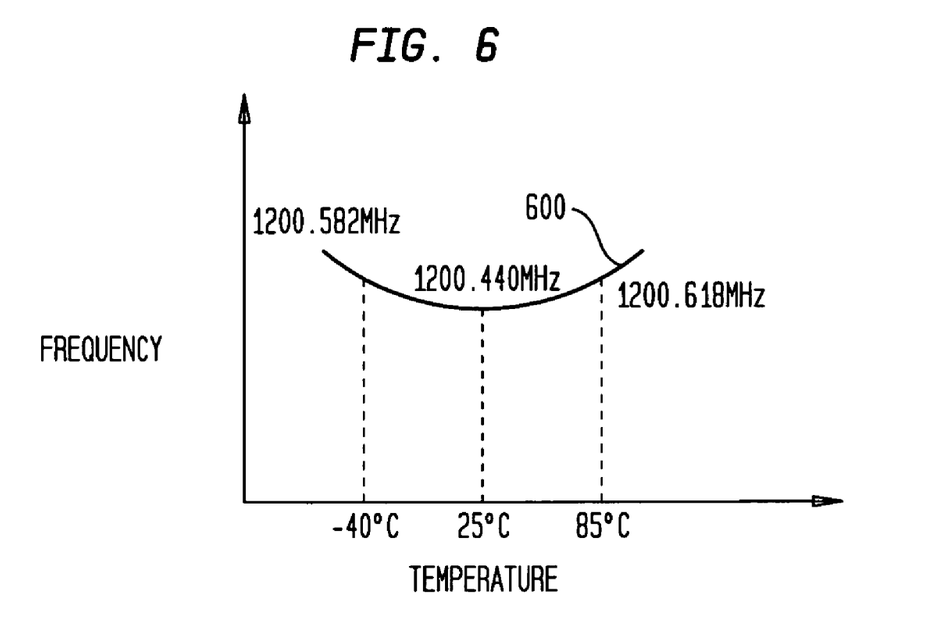
FIG. 6 illustratively depicts a user-definable thermal profile plot over the temperature range of −40° C. to +85° C. in accordance with an aspect of the present invention.
Figure 7:
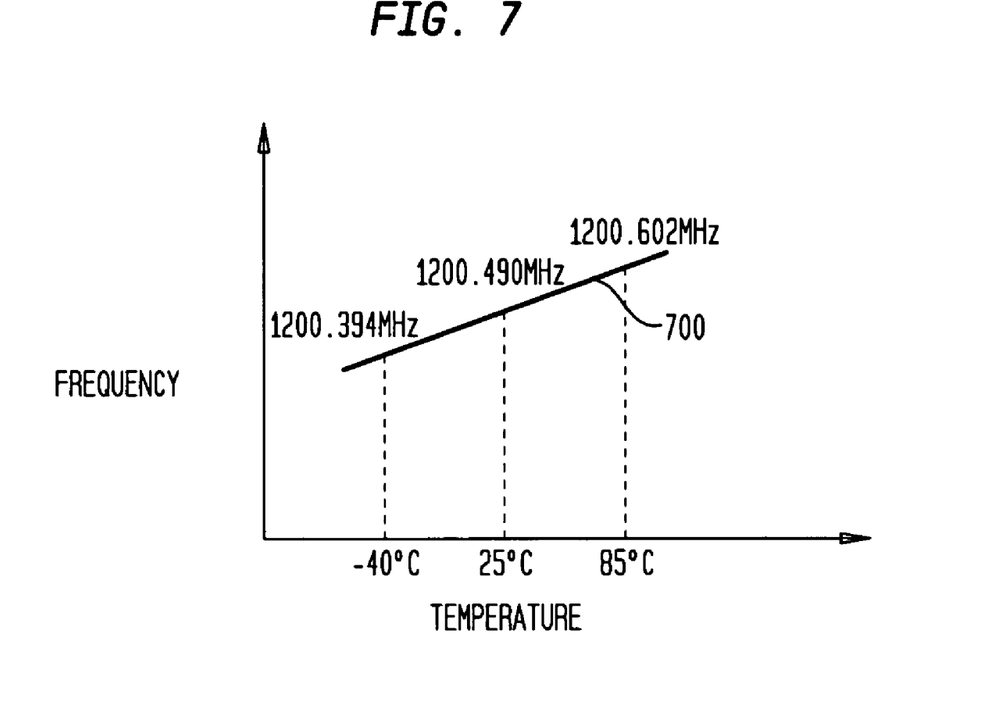
FIG. 7 illustratively depicts a user-definable thermal profile plot over the temperature range of −40° C. to +85° C. in accordance with an aspect of the present invention.
Figure 8:
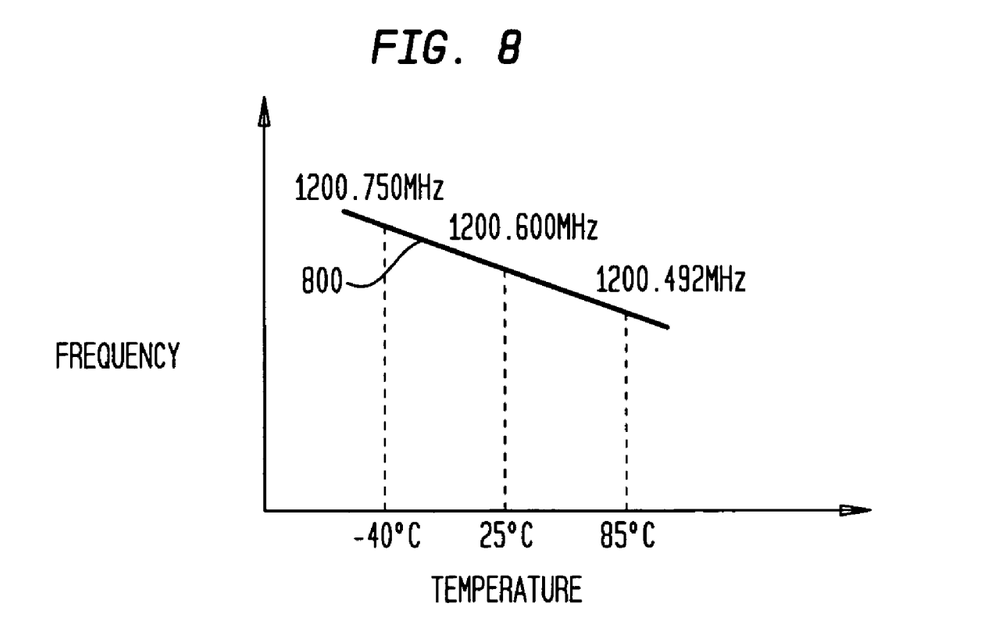
FIG. 8 illustratively depicts a user-definable thermal profile plot over the temperature range of −40° C. to +85° C. in accordance with an aspect of the present invention.

In particular, the L/W ratio and d may be selected to provide a thermal profile as shown in FIGS. 5–8. For example, as shown in FIG. 5 the thermal profile 500 may be designed to take the shape of a parabola over the operating temperature range of −40° C. to 85° C. The dimensions of the board 440 for providing a parabolic thermal profile as shown in FIG. 5 are as follows: $l_1/w_1=1$, $l_2/w_2=0.5$, d=0.01 inch, h=11 mils. In addition, $l_1$=0.06 inches, $w_1$=0.06 inches, $l_2$=0.03 inches, $w_2$=0.06 inches and $e_r$=10. FIGS. 6–8 may be achieved by adjusting the ratios of l/w. Furthermore, by changing the dimensions of the board, different user definable profiles may be achieved. As shown, in FIG. 6 the thermal profile 600 may take the shape of an inverted parabola. FIGS. 7 and 8 illustrate linear thermal profiles 700, 800. In addition, as shown in FIGS. 7 and 8 the thermal drift is less than 100 kHz.

Figure 9:
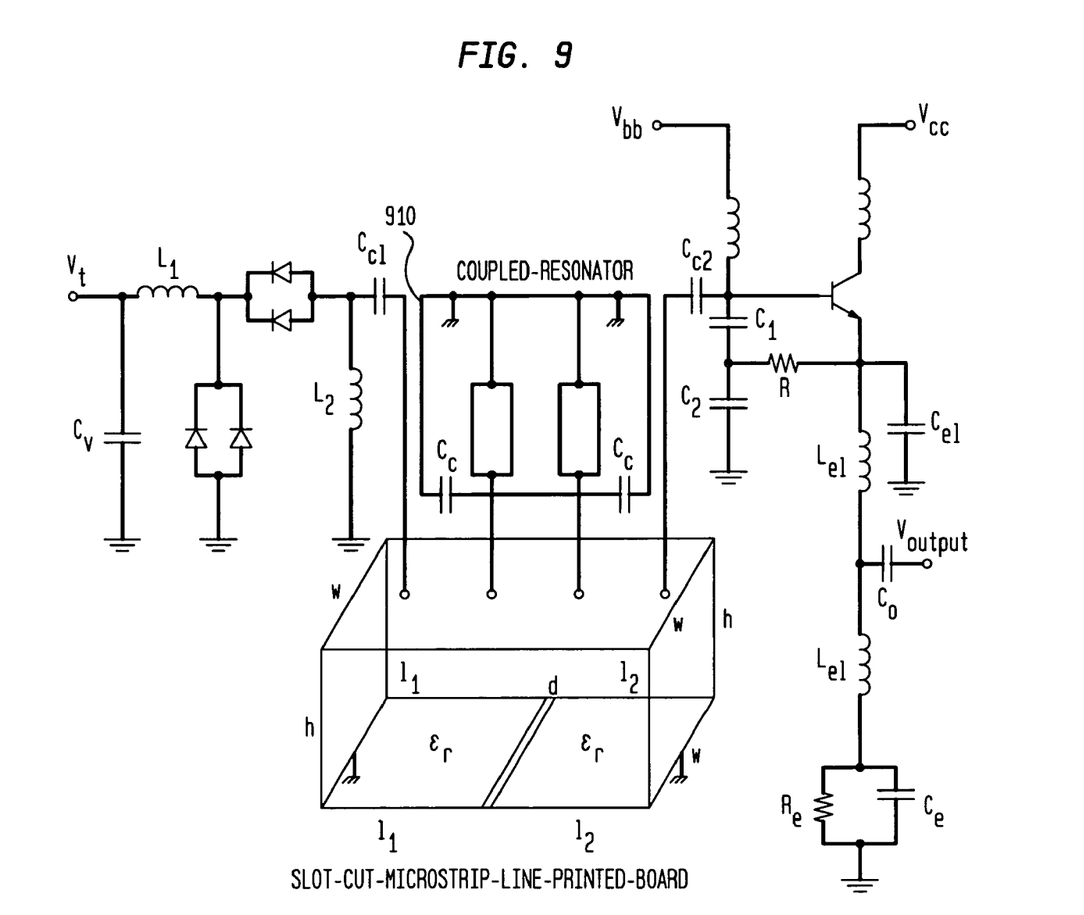
FIG. 9 depicts a schematic of an oscillator in accordance with an aspect of the present invention.

Turning now to FIG. 9, there is shown an oscillator 900 in accordance with an aspect of the present invention. The oscillator 900 includes similar circuitry to FIG. 5 except that the resonator 910 includes a pair of ceramic resonators coupled in parallel with each other.

Figure 10:
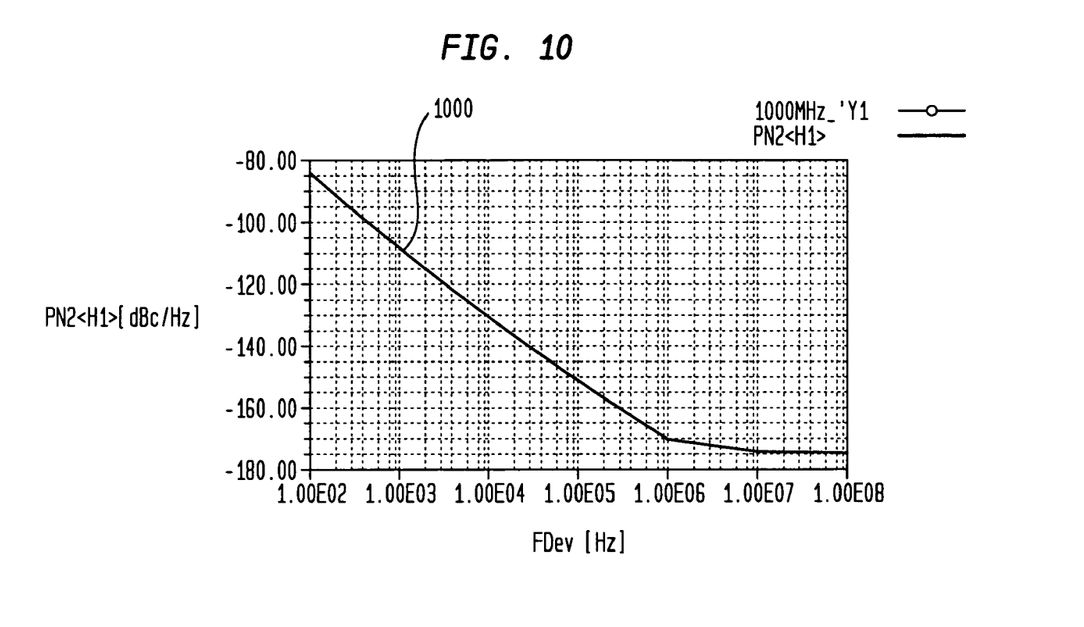
FIG. 10 illustratively depicts a phase noise plot of an oscillator implemented in accordance with an aspect of the present invention.

FIG. 10 shows a phase noise plot 1000 of an oscillator operating at 1200 MHz in accordance with an aspect of the present invention. As FIG. 10 shows, the phase noise is approximately −110 dBc/Hz at 1 kHz.

A voltage-controlled oscillator implemented in accordance with the present invention may be employed in any number of devices that are used to communicate on data, telephone, cellular or, in general, communications networks. Such devices may include but are not limited to, for example, cellular phones, personal digital assistants, modem cards, lap tops, satellite telephones. As a general matter, the oscillator circuitry shown in the various drawings and described above may be employed in a PLL to either generate a clock signal that may be used to transmit or recover information transmitted or received over a network. In addition to wireless networks, the circuitry of the present invention may be employed in wired networks, satellite networks, etc.

In addition, and in accordance with additional aspects of the present invention, the slot-cut-microstrip-line board or coupling capacitor as described above may be further integrated with coupled resonator oscillators disclosed in commonly assigned U.S. patent application Ser. Nos. 10/912,209 and 10/937,525, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An oscillator, comprising:
    an active device having first, second and third terminals;
    circuitry coupled between the first and second terminals of said active device and operative to provide a bias voltage to said active device and feedback a select amount of phase noise into said active device; and
    a tuning diode network coupled to the second terminal of said active device through a slot-cut-printed-board coupling circuit, the slot-cut-printed-board coupling circuit including a base having a width dimension w, a height dimension h, length dimensions $l_1$ and $l_2$, and a slot of width d, the slot dividing the base into two regions defined by $l_1$ and $l_2$, and
    wherein the ratio of $l_1/w$ or $l_2/w$ is selected for a given dielectric constant $\epsilon_r$ and the slot width d to define a thermal profile for compensating for thermal drift associated with the oscillator over a tuning voltage range.

2. The oscillator of claim 1, wherein the slot-cut-printed-board coupling circuit acts as an evanescent mode buffer between a resonator coupled thereto and said active device.

3. The oscillator of claim 1, wherein the thermal profile comprises a parabolic or linear relationship between frequency and temperature.

4. The oscillator of claim 1, further comprising a feedback capacitor coupled between the second and third terminals.

5. The oscillator of claim 1, further comprising a first filter and a second filter coupled to the third terminal of said active device so as to provide two-stage regenerative filtering.

6. The oscillator of claim 5, further comprising means coupled between said first and second filters for providing an output signal.

7. The oscillator of claim 1, wherein said active device comprises a field effect transistor and the first, second and third terminals respectively comprise the source, gate and drain nodes of the transistor.

8. The oscillator of claim 1, wherein said active device comprises a bipolar transistor and the first, second and third terminals respectively comprise the collector, base and emitter nodes of the transistor.

9. A voltage controlled oscillator, comprising:
an active device; and
circuitry coupled between a resonator, a tuning diode network and the active device, said circuitry operating as an evanescent mode buffer between the resonator and said active device, the circuitry comprising a slot-cut-printed-board operable to control a thermal drift profile associated with the oscillator, the slot-cut-printed circuit board comprising a base having a width dimension w, a height dimension h, a first length dimension $l_1$, a second length dimension $l_2$ and an area having a width dimension d located between the regions defined by $l_1$ and $l_2$, and
wherein the thermal drift profile is definable by selection of at least one of the length dimensions.

10. The oscillator of claim 9, wherein the ratio of $l_1/w$ or $l_2/w$ is selected for a given dielectric constant $\epsilon_r$ and the width of the area to define a thermal profile for compensating for thermal drift associated with the oscillator over a tuning voltage range.

11. The oscillator of claim 10, wherein the thermal profile comprises a parabolic or linear relationship between frequency and temperature.

12. The voltage controlled oscillator of claim 9, wherein the tuning diode network is capacitively coupled to said circuitry.

13. The voltage controlled oscillator of claim 9, further comprising a network coupled to said active device for biasing said active device.

14. The voltage controlled oscillator of claim 9, wherein the resonator comprises a ceramic resonator.

15. The voltage-controlled oscillator of claim 9, wherein the resonator comprises a pair of ceramic resonators coupled in parallel.

16. The voltage-controlled oscillator of claim 9, further comprising a first filter and a second filter coupled to the active device so as to provide two-stage regenerative filter at an output port of the oscillator.

17. The voltage controlled oscillator of claim 9, wherein said active device comprises a field effect transistor.

18. The voltage controlled oscillator of claim 9, wherein said active device comprises a bipolar transistor.

19. An apparatus, comprising:
a phase lock loop for generating a clock signal used to transmit or recover information communicated from or to the apparatus,
wherein the phase lock loop includes a voltage-controlled oscillator for generating the clock signal, the voltage controlled oscillator comprising,
an active device; and
a slot-cut-micro-stripline printed board coupled between a resonator, a tuning diode network and the active device and operable to act as a common-coupling capacitor between the resonator, the tuning diode network and said active device, the slot-cut-printed-board coupling circuit including a base having a width dimension w, a height dimension h, length dimensions $l_1$ and $l_2$, and a slot d, the slot d dividing the base into two regions defined by $l_1$ and $l_2$, and wherein the ratio of $l_1/w$ or $l_2/w$ is selected for a given dielectric constant $\epsilon_r$ and the width of the slot d to define a thermal profile for compensating for thermal drift associated with the oscillator over a tuning voltage range.

20. The apparatus of claim 19, wherein the apparatus comprises a wireless device.

21. The apparatus of claim 19, wherein the wireless device is a cellular telephone.

22. The apparatus of claim 19, wherein the apparatus comprises a personal digital assistant.

23. A telephone, comprising:
a phase lock loop for generating a clock signal used to transmit or recover information communicated from or to the telephone,
wherein the phase lock loop includes a voltage-controlled oscillator for generating the clock signal, the voltage controlled oscillator comprising,
an active device; and
circuitry coupled to a resonator, a tuning diode network and the active device,
the circuitry comprising a slot-cut-printed-board operable to control a thermal drift profile associated with the oscillator, the slot-cut-printed circuit board comprising a base having a width dimension w, a height dimension h, a first length dimension $l_1$, a second length dimension $l_2$ and a slot having a width dimension d located between the regions defined by $l_1$ and $l_2$, and
wherein the thermal drift profile is definable by selection of at least one of the length dimensions.

24. The telephone of claim 23, wherein the information is communicated over a wireless network.

25. The telephone of claim 23, wherein the information is communicated over a wired network.

26. A method of defining a thermal profile of an oscillator, comprising coupling a slot-cut-printed board between a resonator, a tuning diode network and an active device, the slot-cut-printed-board including a base having a width dimension w, a height dimension h, length dimensions $l_1$ and $l_2$, and a slot of width d, the slot dividing the base into two regions defined by $l_1$ and $l_2$;
selecting the length to width ratio of the slot-cut-printed-board for a given dielectric constant $\epsilon_r$ and slot d to define a thermal profile; and operating the slot-cut-printed board between the resonator and the active device to compensate for drifts in an output frequency of the oscillator due to temperature changes.

27. The method of claim 26, further comprising biasing the active device at predetermined voltage such that the capacitor maintains the predetermined voltage level to compensate for drifts in an output frequency of the oscillator due to temperature changes.

28. The method of claim 26, wherein the evanescent mode buffer compensates for drifts in the output frequency of the oscillator due to temperature changes by storing additional energy generated by the oscillator due to temperature changes.

* * * * *